(12) United States Patent
Barabi et al.

(10) Patent No.: US 6,354,859 B1
(45) Date of Patent: Mar. 12, 2002

(54) COVER ASSEMBLY FOR AN IC SOCKET

(75) Inventors: Nasser Barabi, Lafayette; Siamak Jonaidi, San Jose, both of CA (US)

(73) Assignee: Cerprobe Corporation, Hayward, CA (US)

( * ) Notice: Subject to any disclaimer, the term of this patent is extended or adjusted under 35 U.S.C. 154(b) by 0 days.

(21) Appl. No.: 09/272,629

(22) Filed: Mar. 18, 1999

Related U.S. Application Data (63) Continuation-in-part of application No. 08/538,956, filed on Oct. 4, 1995.
(60) Provisional application No. 60/078,525, filed on Mar. 18, 1998.

(51) Int. Cl.[7] .............................................. H01R 13/62
(52) U.S. Cl. ....................................................... 439/331
(58) Field of Search ...................... 439/331, 83, 71–73, 439/330

(56) References Cited

U.S. PATENT DOCUMENTS

| | | | | |
|---|---|---|---|---|
| 5,086,269 A | * | 2/1992 | Nobi ........................... 324/760 |
| 5,127,837 A | * | 7/1992 | Shah et al. ..................... 439/71 |
| 5,244,404 A | * | 9/1993 | Kishi et al. ................. 439/331 |
| 5,387,120 A | * | 2/1995 | Marks et al. ................ 439/331 |
| 5,647,756 A | * | 7/1997 | Twigg et al. ................ 439/331 |
| 5,688,128 A | * | 11/1997 | Ikeya ........................... 439/73 |
| 5,793,618 A | * | 8/1998 | Chan et al. .................. 361/809 |
| 5,924,183 A | * | 7/1999 | Kelley et al. ............... 29/401.1 |
| 5,997,316 A | * | 12/1999 | Kunzel ......................... 439/73 |

* cited by examiner

Primary Examiner—Brian Sircus
Assistant Examiner—Brian S. Webb
(74) Attorney, Agent, or Firm—Donald L. Beeson (57) ABSTRACT

A cover assembly for IC chip has a lid portion and a retractable chip depressor member extendable from the underside of the lid portion along the lid's z-axis. When the cover assembly is mounted over the chip cavity of an IC socket and is properly indexed in the x-y plane of the socket, the retractable chip depressor member is retractable advanced along the z-axis of the lid portion to contact and depress the chip in the socket's chip cavity by a force that is parallel to the z-axis of the chip cavity and that is normal to the IC chip.

2 Claims, 10 Drawing Sheets

COVER ASSEMBLY FOR AN IC SOCKET

CROSS-REFERENCE TO RELATED APPLICATIONS

This application claims the benefit of U.S. Provisional Application No. 60/078,525 filed Mar. 18, 1998, and is a continuation-in-part of application Ser. No. 08/538,956 filed Oct. 4, 1995, now pending.

BACKGROUND OF THE INVENTION

The present invention generally relates to sockets for IC chips, and more particularly to the construction of cover assemblies for IC sockets which hold the input/output (I/O) contacts of an IC chip in electrical contact with the compliant tips of an array of conductive probes.

Sockets for holding IC chips are well known and widely used in a variety of industrial applications for achieving efficient electrical contact between the I/O contacts of an IC chip and the conductors of a connector, circuit board, or the like. Such applications include test sockets for testing IC devices and contactor sockets for removably mounting an IC device to a printed circuit board. The basic function of the socket is to hold the IC chip in a fixed position such that the array of I/O contacts can be contacted by the compliant tips of a corresponding pogo pin array to produce a desired electrical connection. Precise orientation of the IC chip in the socket is critical to this function and generally to the electrical and mechanical performance of the socket. One aspect of this orientation is to maintain the chip in a true x-y plane as the chip is pressed in the z-axis against the compliant tips of the socket's probe array. Any tilting or canting of the chip from its desired x-y orientation can cause the chip, or a floating platform holding the chip, to bind up in the socket and can prevent the desired electrical interface with each and all of the I/O contacts of the chip.

Socket covers generally provide for a protruding structure that is integral with the underside of the cover and that is positioned and formed to contact and depress the IC chip in a cavity within the IC socket when the cover is operatively attached to the top of the socket. Conventionally, the socket cover is either separate from the socket or hinged to the socket. In either case, as the socket cover is moved to its closed position, slight misalignments occur between the socket and socket cover which are detrimental to maintaining the x-y positioning of the chip in the socket. For a hinged cover, this alignment is due to the fact that the depressor structure on the underside of the cover contacts the IC chip before the cover reaches a fully rotated closed position. At this point of contact, the force of the cover pushing against the chip is not a true normal force in reference to the x-y plane of the chip. In a separately attached cover that is not hinged to the socket, misalignments will occur when a cover is placed by hand over the socket at any angle of attack that is not precisely normal to the socket's x-y plane.

The present invention provides a cover assembly for an IC socket that overcomes the aforementioned disadvantages of conventional socket cover designs. The invention specifically provides a socket cover assembly that permits a depressor member on the underside of the socket cover to contact the IC chip held in the socket at an angle of attack that is precisely controlled, and that prevents misalignment between the axis of the socket and the force vector applied by the cover's depressor member against the IC chip. The invention will minimize any tendency of the chip or chip platform to tilt within the socket thereby improving the socket's overall electrical and mechanical performance.

SUMMARY OF THE INVENTION

Briefly, the invention is a cover assembly for operatively holding an IC chip in a chip cavity of an IC socket wherein the chip cavity extends into a top face of the IC socket along a defined z-axis. The cover assembly includes a lid portion having a top side, an underside, and a defined z-axis, and mounting means for mounting the lid portion in an operative position on the IC socket. The mounting means includes cover locking means for locking the lid portion of the cover assembly in an operative closed position in which the z-axis of the lid portion aligns with the z-axis of the chip cavity. The lid portion is provided with a retractable chip depressor member extendable from the underside of the lid portion along the lid's z-axis. When the lid portion is in its operative closed position over the chip cavity of the socket, the retractable chip depressor member is advanced along the z-axis by a depressor actuation means accessible from the top side of the lid portion, whereby the chip is at all times depressed in the IC socket by a force parallel to the z-axis of the chip cavity and normal to the IC chip.

In one aspect of the invention, the mounting means of the cover assembly includes slide rails for slidably engaging corresponding locking channels formed in the IC socket to which the lid portion is mounted. The slide rails are pivotally connected to the lid portion such that, when the slide rails are engaged in the locking channels of the socket, the lid portion can be pivoted on the slide rails into its operative close position.

In another aspect of the invention, the mounting means includes a mounting frame which is likewise pivotally connected to the lid portion of the cover assembly. The mounting frame has fastening means for fastening the frame to the top face of the socket such that, when the mounting frame is fastened to the socket, the lid portion can be pivoted on the mounting frame into its operative closed position. This embodiment has particular utility where space considerations are paramount, since an entire cover assembly can be provided which matches the footprint of the socket.

The invention also contemplates a mounting means that permit the lid portion of the cover assembly to be directly fastened to the IC socket such as by a releasable clip lock means that engage a corresponding clip lock engagement structure on the IC socket.

The depressor actuation means can suitably be provided by a cam mechanism for converting a rotational actuation motion imparted by a handle on the top side of the lid portion to a translational depressing motion of the depressor member in the z-axis of the lid portion. Alternatively, the lid portion of the cover assembly can be provided with a threaded guide hole and the chip depressor member and depressor actuation means can be provided in the form of a threaded cylinder threadedly engaged in the guide hole such that rotation of the threaded cylinder in the guide hole causes the cylinder to advance along the z-axis of the lid.

Finally, the invention includes a method of depressing an IC chip in a chip cavity of an IC socket having a z-axis normal to the plane of the IC chip held in the socket. The method is comprised of placing the IC chip in the chip cavity of the socket and then covering the IC chip with a cover assembly so as to achieve alignment with the z-axis of the chip cavity. From the cover assembly, the IC chip is then contacted and depressed in the IC cavity along the z-axis, such that the contact force is at all times normal to the IC chip.

Therefore, a primary object of the present invention is to provide a cover assembly and method for contacting and depressing an IC chip in the IC cavity of an IC socket with a force that at all times is maintained in a direction that is parallel to the z-axis of the IC chip and thus in a direction that is normal to the IC chip. It is another object of the invention to provide a cover assembly that is easily installed on the IC socket and then positively locks onto the socket in a desired orientation. It is a further object of the invention to provide a cover assembly for an IC socket that improves the electrical and mechanical performance of the socket. Other objects of the invention will be apparent from the following specification and claims, as well as from the illustrated embodiment shown in the accompanying drawings.

DETAILED DESCRIPTION OF THE ILLUSTRATED EMBODIMENT

Figure 1:
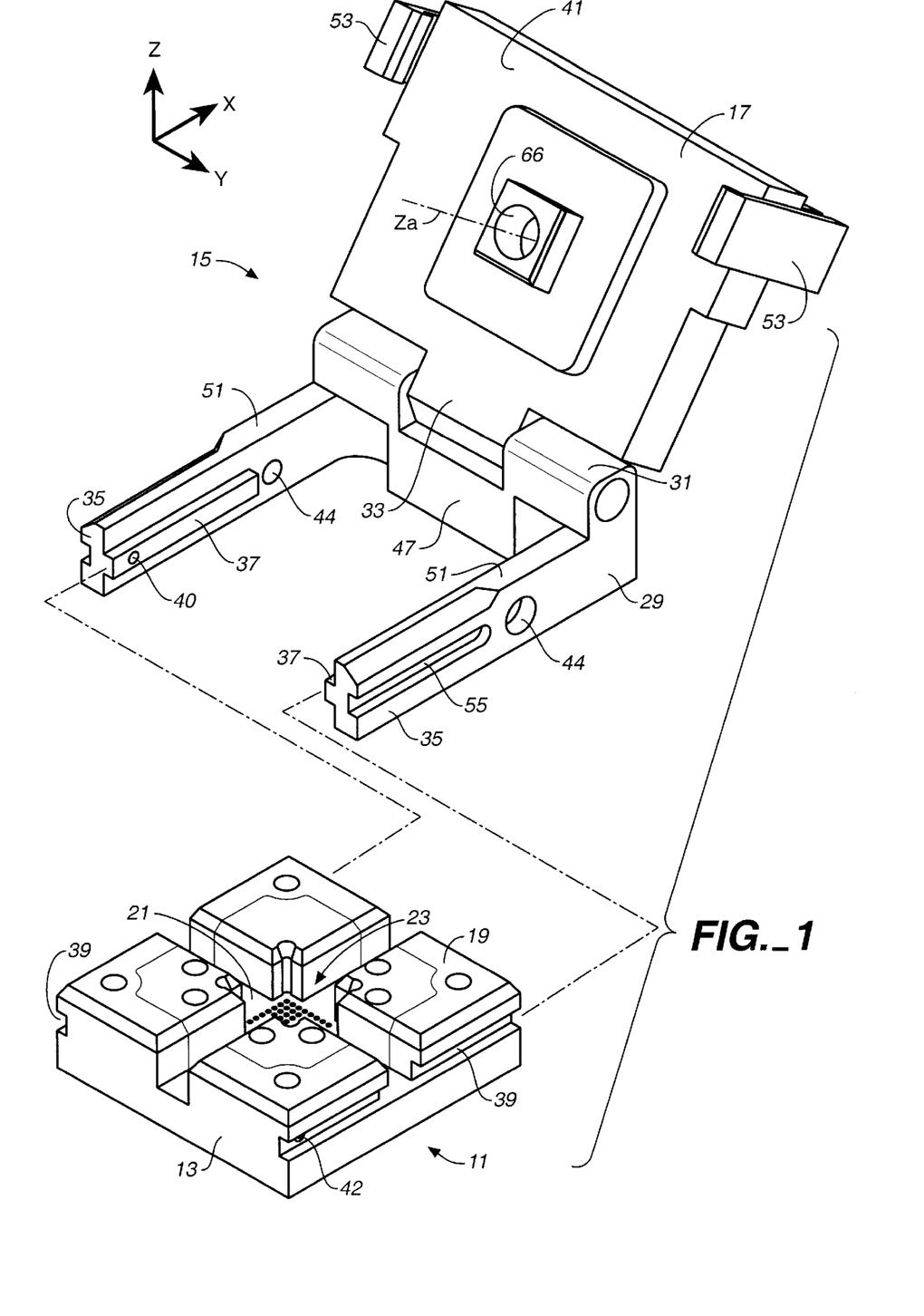
FIG. 1 is an exploded top perspective view of a cover assembly in accordance with the invention together with an associated IC socket.

Referring now to the drawings, FIGS. 1–4 illustrate one version of an IC socket and cover assembly in accordance with the invention. The IC socket 11 generally includes a body portion 13 having x-y-z coordinates as illustrated in FIG. 1, while the cover assembly 15 includes a lid portion 17 having a z-axis which aligns with the z-axis of the socket body when the lid portion of the cover assembly is operatively closed as hereinafter described. The z-axis of the lid portion is denoted by the letter "Za" in FIG. 1.

Figure 2:
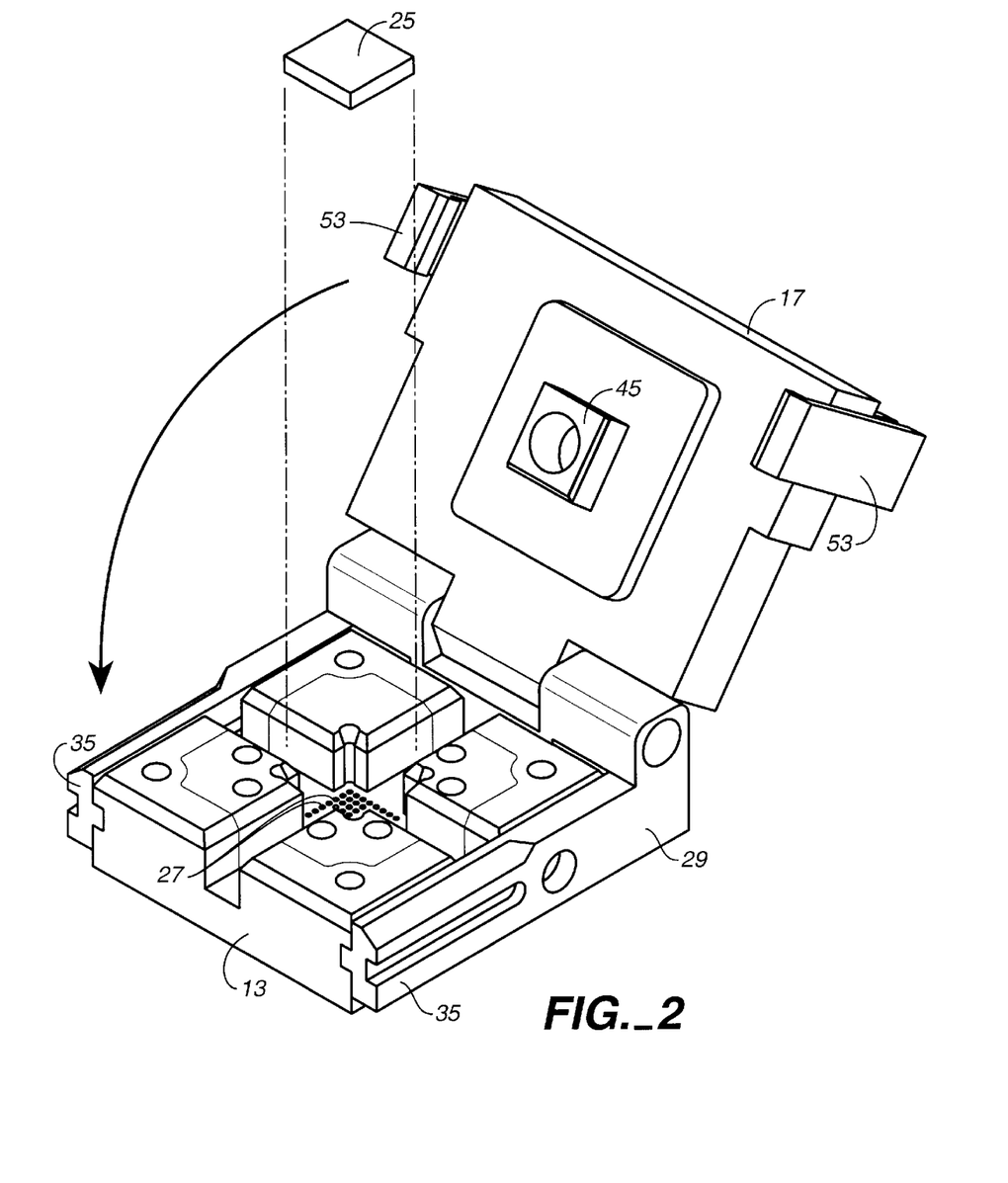
FIG. 2 is a top perspective view of the IC socket and cover assembly shown in FIG. 1 with the cover assembly mounted to the socket and the lid portion of the cover assembly in its up position.

The IC socket body includes a top face 19, a bottom wall portion 21, and a central chip cavity 23 that extends along the socket's z-axis from the socket's top face to its bottom wall. As shown in FIG. 2, the central chip cavity of the socket is sized and shaped to receive a planar IC chip 25 having an array of I/O contacts 26 (see FIG. 5A) on the underside of the chip. By placing the IC chip in the socket's chip cavity 23 with the I/O contacts face down, the I/O contacts can be made to contact the compliant tips of an array of corresponding pogo pin probes (not shown) made to contact the compliant tips of an array of corresponding pogo pin probes (not shown) extending from the bottom wall of the socket. The location and configuration of the pogo pin probe array at the bottom of the chip cavity is generally illustrated by the hole pattern 27 shown in FIGS. 1 and 2. The function of the cover assembly is to hold the IC chip in contact with this pogo pin array after the chip is inserted into the cavity.

Figure 3:
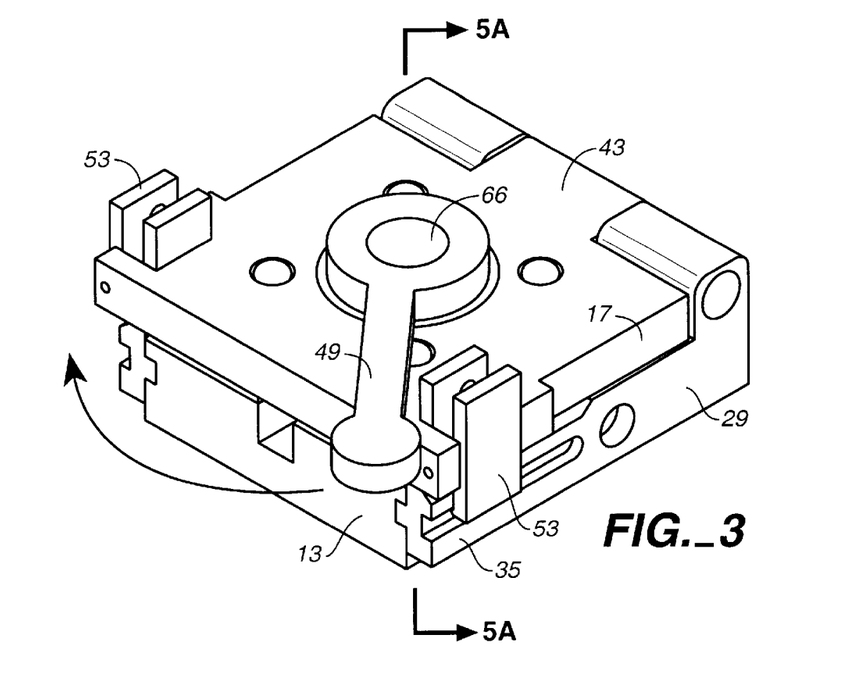
FIG. 3 is a top perspective view of the IC socket and cover assembly shown in FIG. 2, with the lid portion of the cover assembly in its closed position, and before turning the depressor actuator handle of the cover assembly.
Figure 4:
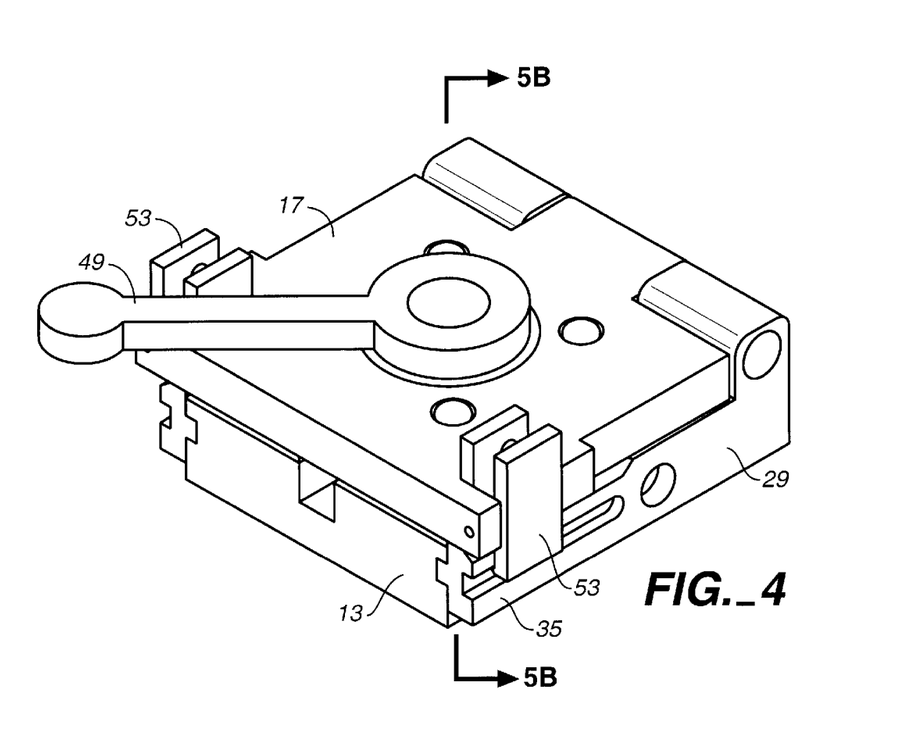
FIG. 4 is a top perspective view of the cover assembly shown in FIG. 3 with the depressor actuator handle rotated to a chip engaged position.

The cover assembly shown in FIGS. 1–4 is seen to include a mounting means in the form of a U-shaped slide bracket 29 having a crosswise hinge structure 31 formed to receive and hingedly connect to a lateral hinge 33 of the cover assembly lid 17. The slide bracket further includes parallel slide rails 35 that extend from the ends of the bracket's hinge structure in a spaced relation that corresponds to the width of the socket to permit the slide rails to slidably engage the socket's lateral side walls. Specifically, it can be seen that the slide rails are provided with interior longitudinal runners 37 formed to engage in corresponding parallel locking channels 39 formed in opposite side walls of the socket. The parallel locking channels, which are in line with the x-axis of the socket, provide a means for efficiently indexing the cover assembly to the x-y plane of the socket when the cover assembly is operatively mounted to the socket and locking the cover assembly in this plane. Such indexing in the x-y plane will, in turn, provide a reference for obtaining alignment of the z-axis, Za, of the cover assembly lid 17 to the z-axis of the socket when the lid portion is operatively closed as shown in FIGS. 3 and 4. Suitable detent holes 40 can be provided on the runners 37 of the slide bracket to receive corresponding detent elements 42 in the locking channels 39 to releasably lock the cover assembly in its fully engaged position. The slide bracket can further be locked in position by means of set screws (not shown) inserted into set screw openings 44 provided in the sides of runners 37.

It is noted that locking channels 39 can be provided on all four sides of socket body 13 as shown in FIGS. 1–3 to permit a cover assembly to fit onto the socket along either the x or the y axis. With a socket body having a square footprint the same cover assembly can thus be used in either orientation.

The lid portion 17 of cover assembly 15 has an underside 41 shown in FIGS. 1 and 2 and a top side 43 shown in FIGS. 3 and 4. A central retractable depressor member 45 that projects inwardly along the z-axis is provided on the underside of the lid, and is sized and shaped to fit within the central chip cavity 23 of the socket when the cover assembly is operatively mounted to the socket and when the cover assembly lid is closed. When the lid 17 is locked into its operative closed position, as shown in FIGS. 3 and 4, the depressor member can be advanced into the chip cavity of the socket by a depressor actuation means in the form of a closure handle 49 accessible from the top side of the lid. By rotating the closure handle from the position shown in FIG. 3 to the position shown in FIG. 4, the depressor member is advanced a suitable distance to engage the IC chip and to depress the chip against the compliant tips of the socket's pogo pin array at the bottom of the chip cavity 23. During rotation of the closure handle, the lid portion of the assembly is held in a true x-y plane relative to the socket by locking the lid portion against top indexing surfaces 51 on the slide rails by means of depressible latches 53 which engage a corresponding latch engagement structure in the form of outer locking channels 55 on the slide rails.

Figure 5A:
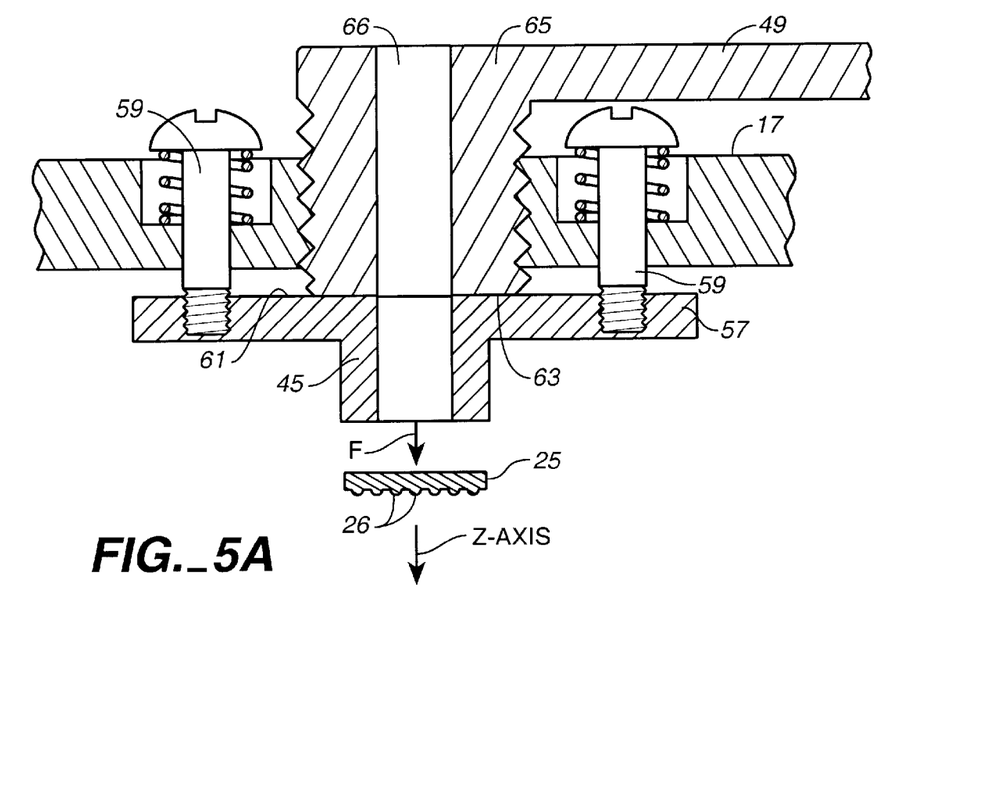
FIG. 5A is a cross-sectional view of the IC socket and cover assembly taken along lines 5A—5A in FIG. 3, illustrating the chip depressor member in its retracted position.
Figure 5B:
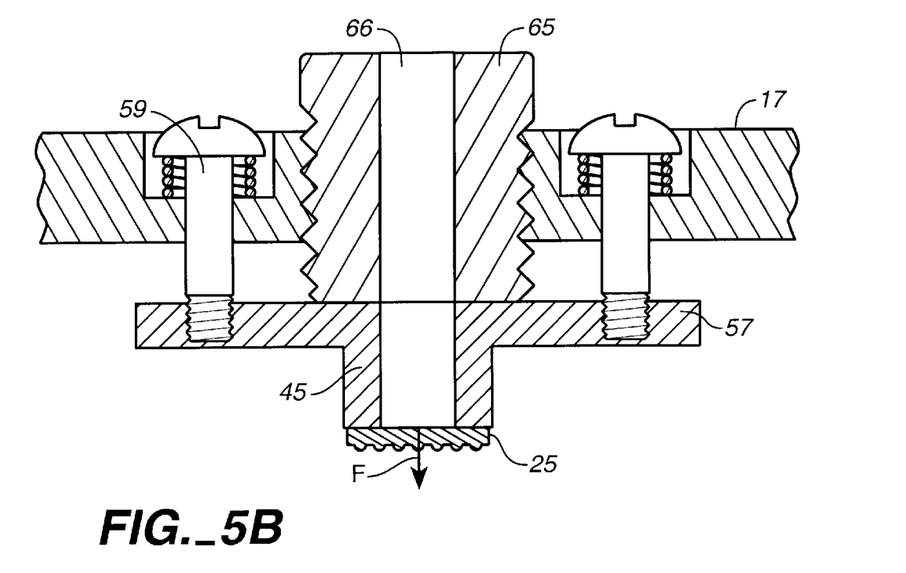
FIG. 5B is a cross-sectional view of the IC socket and cover assembly shown in FIG. 4 taken along lines 5B—5B, illustrating the chip depressor member in its extended engaged position.

FIGS. 5A and 5B show in greater detail the cam mechanism for converting the rotational actuation motion of the closure handle to a translational depressing motion by the depressor member 45 along the z-axis, Za, of the lid 17. It is seen that the depressor member 45 is integrally formed on the bottom of a depressor plate 57 which is fastened to the underside of lid 17 by means of spring loaded screw fasteners 59 that permit z-axis travel of the plate and depressor member. The top surface 61 of the plate 57 is contacted by the projecting end 63 of the cylindrical base 65 of the closure handle 49, which is threaded and which threadedly engages in the lid portion of the cover assembly such that rotation of the handle as shown in FIGS. 3 and 4 will cause the threaded base to advance against the depressor plate. The threaded base of the closure handle effectively provides a cam mechanism for advancing the depressor plate and projecting depressor member in the z-axis of the lid 17.

It is noted that a vent hole 66 extends through base 65 of the closure handle as well as through the depressor plate and depressor member 57, 45. Hot or cool air can be blown into this vent hole to either heat or cool the test chip 25 as it is held in the socket.

To summarize the use of the cover assembly illustrated in FIGS. 1–4 and FIGS. 5A and 5B, an IC chip 25 is first inserted with its I/O contacts down into the chip cavity 23 of socket base 13, and the cover assembly mounted to the socket by sliding the slide rails 35 of the assembly's U-shaped slide bracket 29 into the locking channels formed in the lateral side walls of the socket. To properly index the depressor member with the chip cavity of the socket, the slide rails must be pushed all the way onto the socket until the socket contacts the stop wall 47 on the bracket's hinge structure. The lid portion is then closed over the socket until the latches 53 lock into position into the locking channels 55 provided on the outside of the slide rails. When lockingly engaged to the slide rails, the lid portion will be indexed to the x-y plane of the socket causing alignment of lid 17 and the socket base 13. In this aligned and indexed position, the closure handle is rotated to advance the depressor member against the IC chip with a depressing force that is at all times normal to the chip as indicated by force vector F in FIGS. 5A and 5B.

Figure 6:
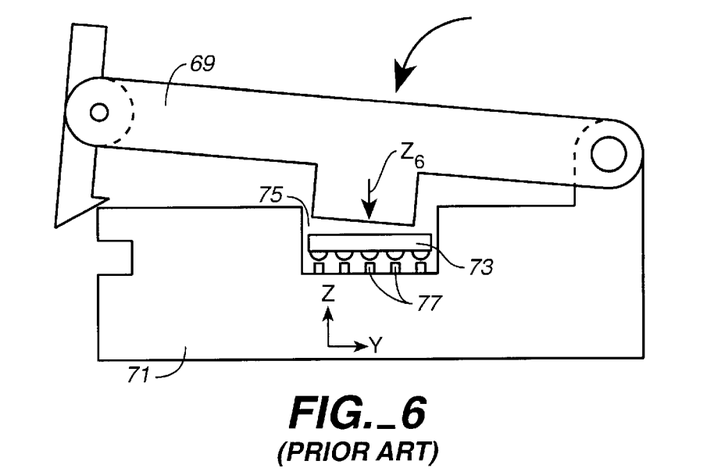
FIG. 6 is a pictorial view of a prior art IC socket and socket cover illustrating the off-axis depressing forces initially exerted on the IC chip when the chip is first contacted by the depressor formed on the underside of the cover.

The above-described operation of the cover assembly of the invention is to be contrasted with a prior art assembly such as shown in FIG. 6, wherein a projecting chip depressing structure 67 is integrally formed on the underside of a cover 69 hinged to the IC socket 71. As the cover is rotated to a closed position, the chip depressing structure will contact the IC chip 73 in the socket's chip cavity 75 at an angle that is slightly misaligned from the z-axis of the socket, as indicated in FIG. 6 by the axis denoted "Zb" for the lid. This misalignment can cause slight tilting of the IC chip in the chip cavity which will affect the ability of the chip's I/O contacts to efficiently engage with each of the pogo pins of the socket's pogo pin array 77.

Figure 7A:
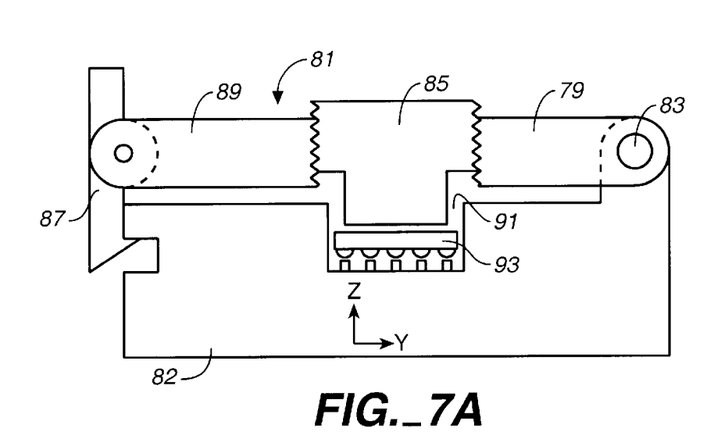
FIG. 7A is a pictorial side elevational view of an alternative embodiment of the invention wherein the lid portion of the cover assembly is hinged to the socket and wherein the retractable depressor member is provided in the form of a threaded cylinder extending through the lid portion of the cover assembly.
Figure 7B:
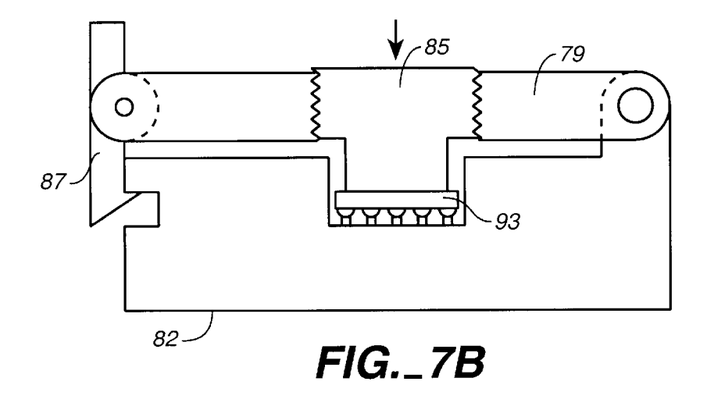
FIG. 7B is a pictorial side elevational view of the IC socket and cover assembly shown in FIG. 7A, with the chip depressor member in its extended engagement position instead of its retracted position.
Figure 8:
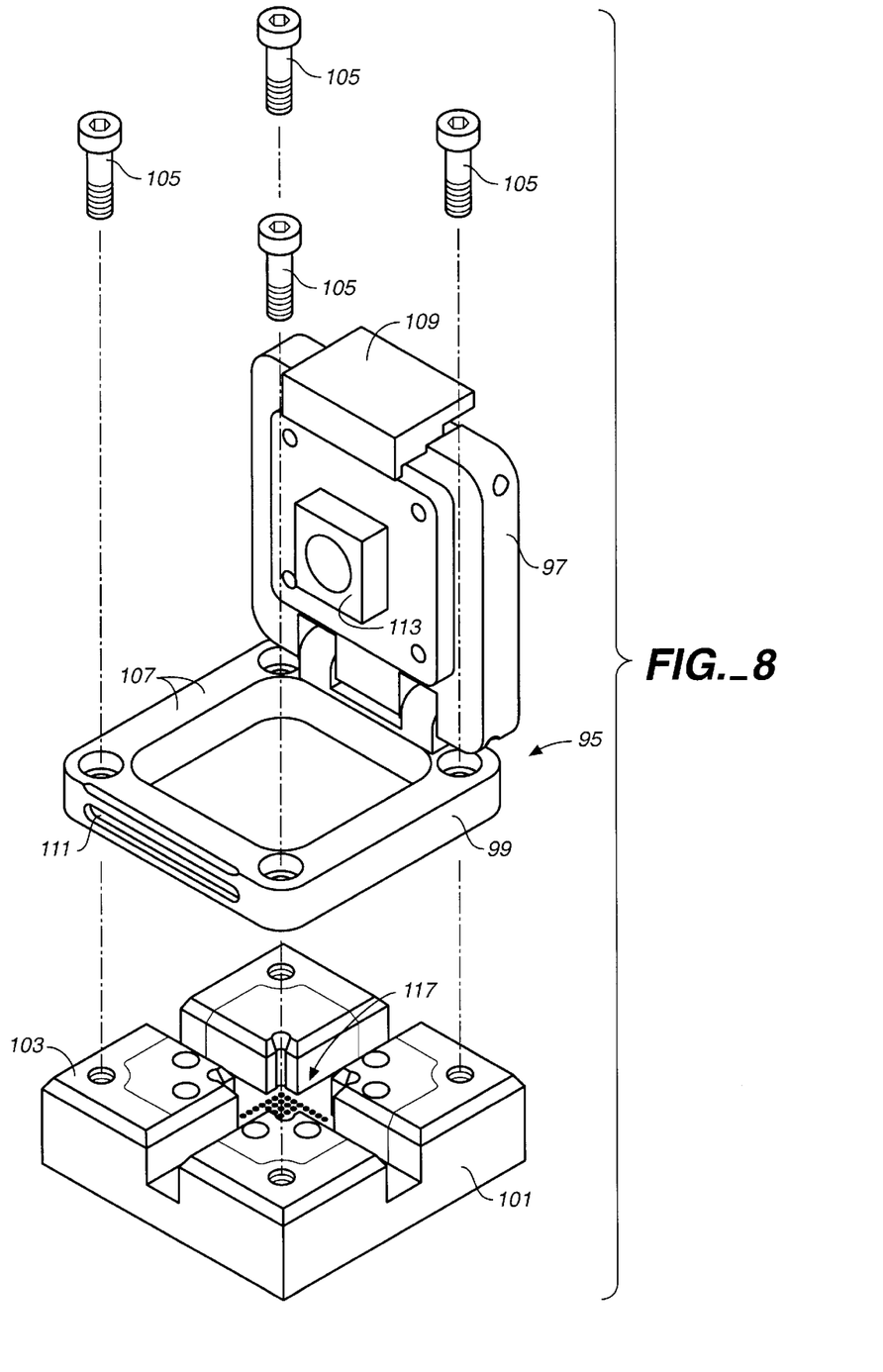
FIG. 8 is an exploded top perspective view of an alternative embodiment of an IC socket and the cover assembly of the invention wherein the lid portion of the cover assembly pivots on a mounting frame having a footprint that conforms to the footprint of the IC socket.
Figure 9:
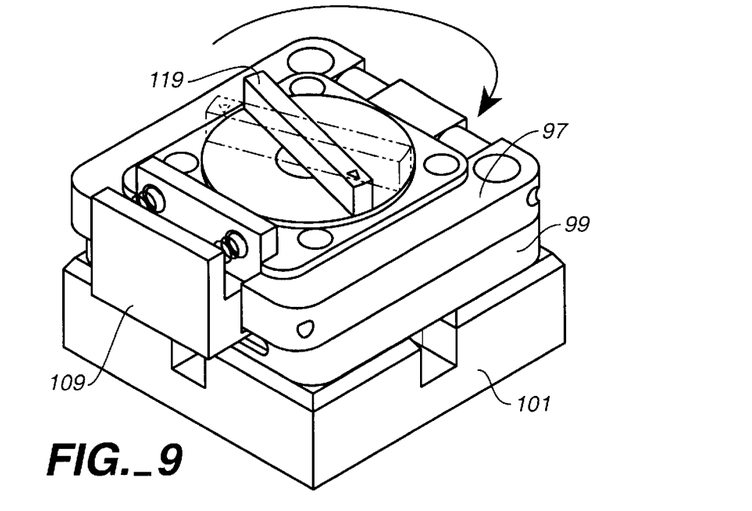
FIG. 9 is a top perspective view of the cover assembly and socket shown in FIG. 8, with the lid portion of their cover assembly in its operative closed position.

FIGS. 7A and 7B pictorially illustrate an alternative construction of the cover assembly of the invention wherein the lid portion 79 of the cover assembly 81 is hinged to the chip socket 82 at hinge point 83, and a separate retractable chip depressor member 85 is engaged in the lid portion. With the depressor member retracted as shown in FIG. 7A, the lid portion can be closed to its operative position and locked into place by means of a depressible latch 87 mounted to the distal edge 89 of the lid portion. In the closed position shown in FIG. 7A, the depressor member is aligned over the socket's chip cavity 91 such that the depressor member can be advanced along the z-axis of the socket to contact and depress the chip 93 as shown in FIG. 7B. The depressor member is suitably accessible from the top side of the lid portion of the cover assembly so that it FIGS. 8 and 9 illustrate yet another embodiment of the invention wherein the cover assembly 95 is comprised of a lid portion 97 hingedly connected to a mounting frame 99 that has a footprint that corresponds to the footprint of the socket 101 to which it is mounted. In this embodiment, the mounting frame is fastened to the top face 103 of the socket by means of suitable screw fasteners 105 for holding down the corners of the mounting frame, and the lid portion is closed over the top indexing surface 107 of the mounting frame to provide indexing of the lid portion to the x-y plane of the socket. A depressible latch member 109 provided at the distal end of the lid portion releasably engages a snap lock channel 111 in the perimeter of the mounting frame to lock the lid portion in its operative closed position as shown in FIG. 9. From this position, the projecting depressor member 113 formed on the bottom of the depressor plate 115 on the underside of the lid portion can be advanced into the chip cavity 117 of the socket by rotating the closure handle 119 on the top side of the lid.

Figure 10:
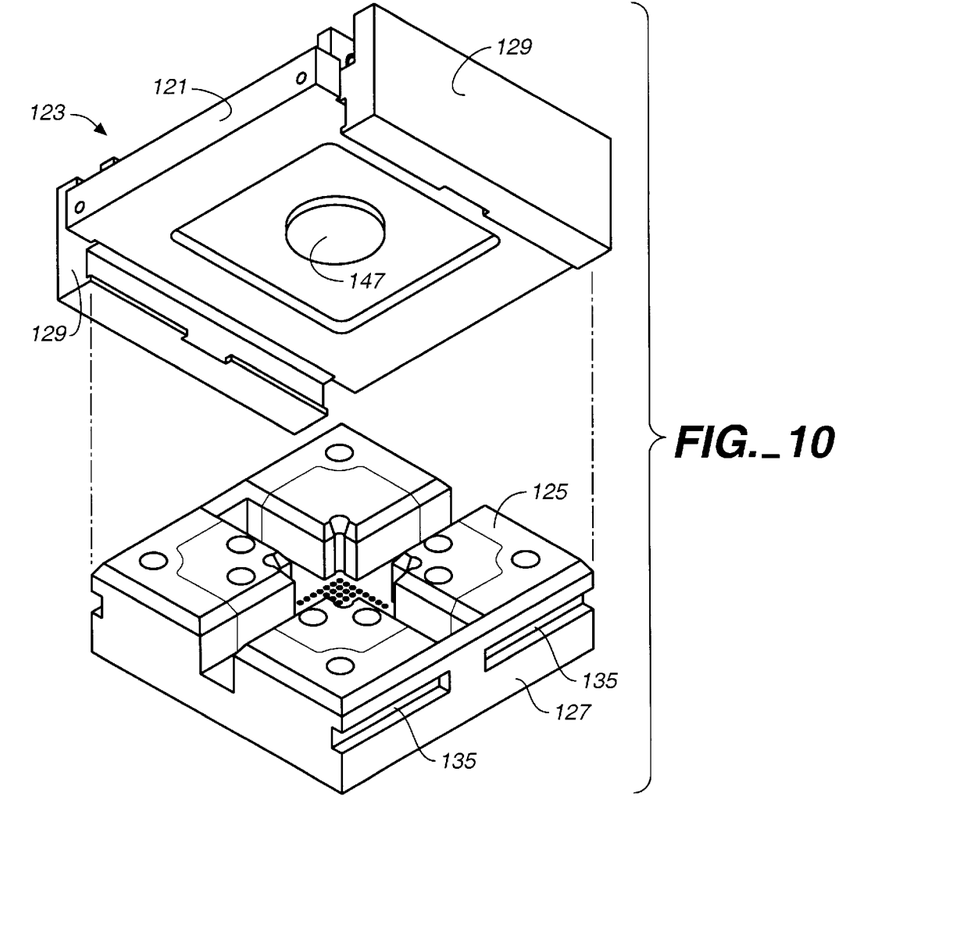
FIG. 10 is an exploded bottom perspective view of a further embodiment of the cover assembly of the invention together, wherein the cover assembly is releasably mounted directly to the socket by depressible latches.
Figure 11:
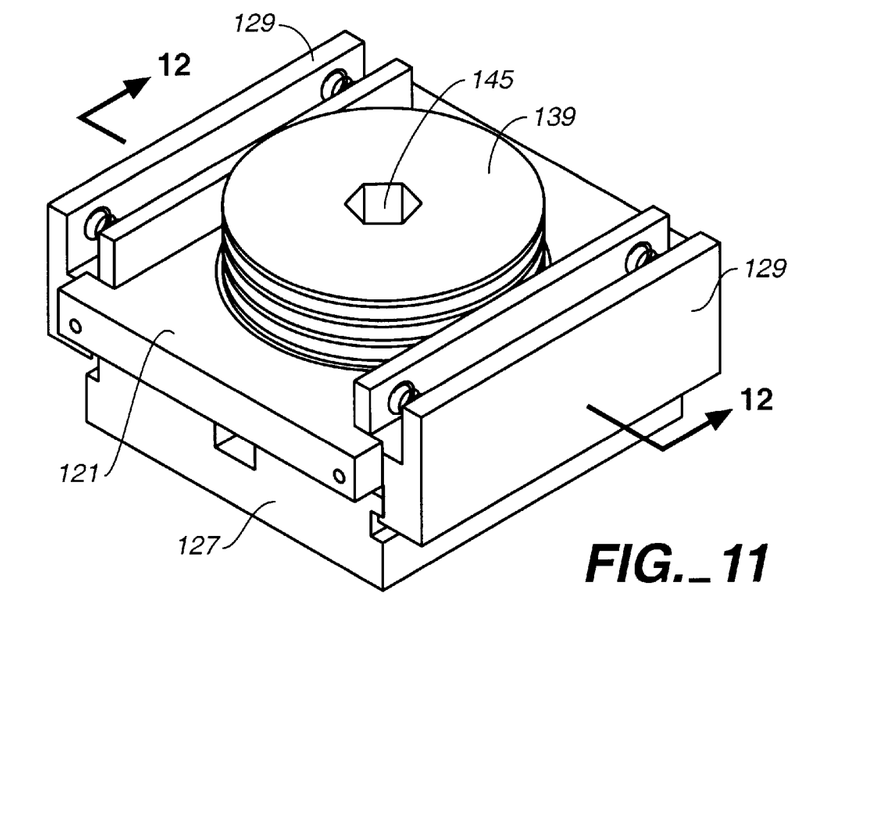
FIG. 11 is a top perspective view of the cover assembly and IC socket shown in FIG. 10 with the cover assembly mounted to the IC socket and showing a heat sink at the top of the chip depressor member.
Figure 12:
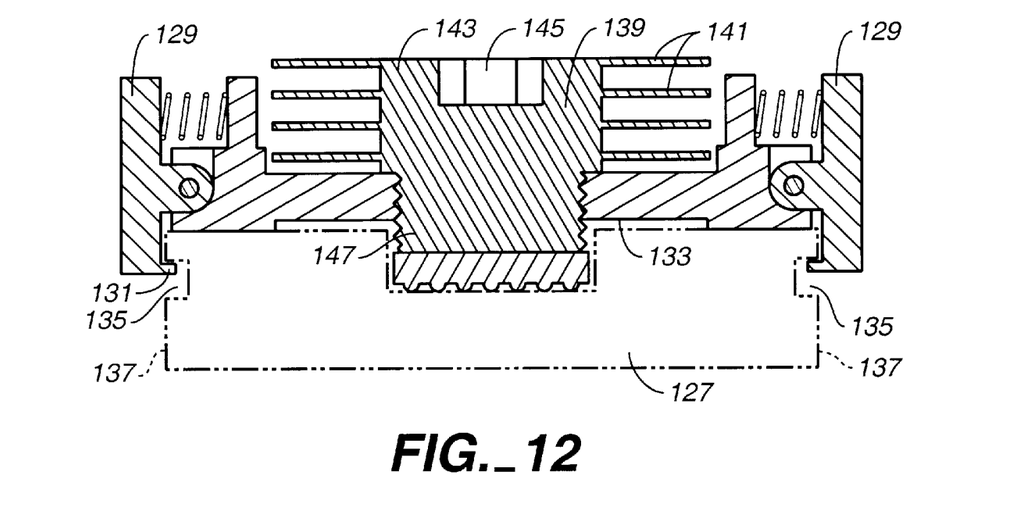
FIG. 12 is a cross-sectional view of the IC socket and cover assembly shown in FIG. 11 taken along lines 11—11, showing a heat sync integrally formed on the top of the depressor member.

In the embodiment illustrated in FIGS. 10–12, a lid portion 121 of the cover assembly 123 is mounted directly to the top face 125 of the socket 127 and locked into position by means of opposed depressible latch mechanisms 129 pivotally attached to opposed lateral ledges of the cover assembly lid. Each of the latch mechanisms includes a bottom locking ridge 131 that extends below the underside 133 of the lid portion to engage parallel locking channels 135 formed along the opposite sidewalls 137 of the socket. The retractable chip depressor member and depressor actuation means is provided in the form of a heat sync member 139 which extends through the lid 121, and which has a series of heat dissipating fins 141 radially extending from the top portion 143 of the heat sync member. The heat sync member can be rotated from the top side of the cover assembly lid by a suitable tool (not shown) having an Allen-head end insertable into the hex shaped opening 145 at the top of the heat sync member. It can be seen that rotation of the heat sync member by such a tool will cause the piston end 147 of the heat sync member to advance or retract along the z-axis of the lid, depending on the direction of rotation.

Figure 13A:
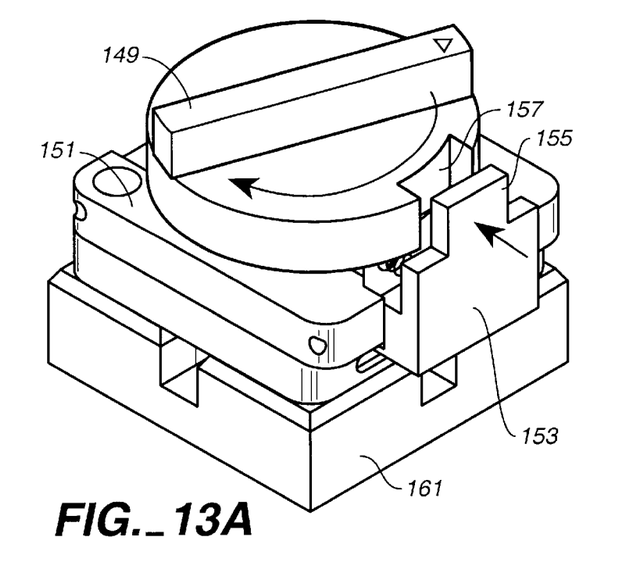
FIG. 13A is a top perspective view of yet another embodiment of the cover assembly of the invention wherein the latch mechanism for locking the lid portion to the mounting frame of the cover also interlocks with the closure handle on the lid portion.
Figure 13B:
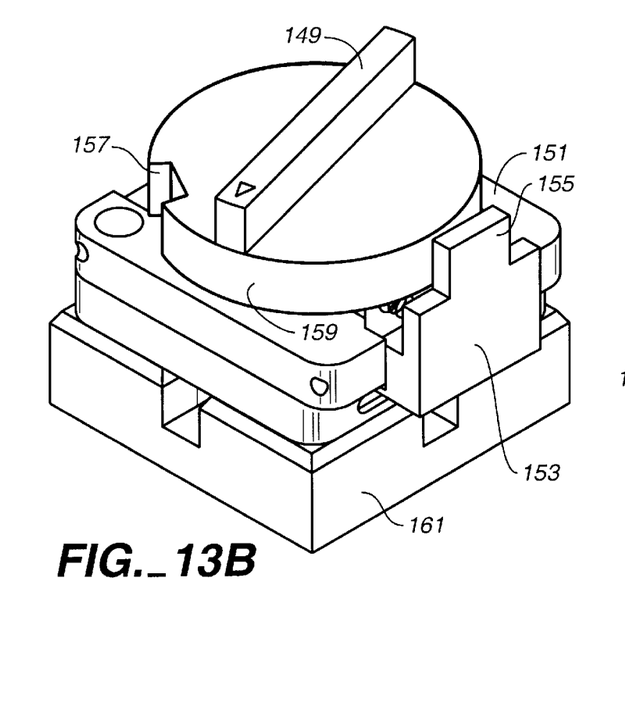
FIG. 13B is another top perspective view thereof showing the closure handle rotated to operatively engage the IC chip in the IC socket.

FIGS. 13A, 13B, 14A, 14B illustrate a locking mechanism which prevents any rotation of the closure handle 149 on top of the cover assembly lid 151 until the cover assembly is locked into its operative closed position as shown in FIGS. 13A and 13B. In this version, a latch member 153 is provided which is spring biased inwardly toward the center of the closure handle such that a tab 155 extending from the top of the latch engages a corresponding notch 157 formed in the perimeter 159 of the closure handle when the notch is registered with the tab. When the tab is engaged in the notch, any rotation of the closure handle will be prevented, thereby preventing any advance of the depressor member on the underside of the cover assembly lid. By suitable placement of the notch, the depressor member can be locked in its fully retracted position until the latch is released by pulling it outwardly to a position shown in FIG. 14A against the spring biasing forces holding it in its locked position. Once the latch is pulled outwardly, the handle can be ed to advance the depressor member to engage the chip in the IC socket 161.

Figure 14A:
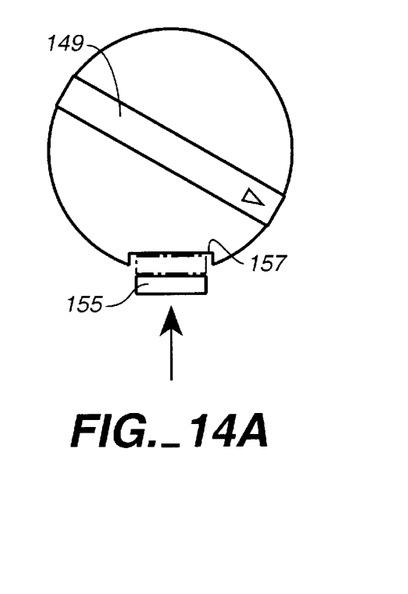
FIG. 14A is a top plan view of the closure handle and the locking tab of the latch mechanism of the cover assembly shown in FIGS. 13A and 13B, illustrating the disengagement of the closure handle from the locking tab.
Figure 14B:
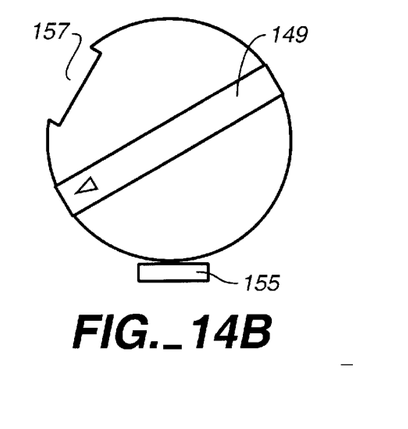
FIG. 14B is a further top plan view thereof showing the locking handle rotated to retain the locking tab of the latch mechanism in its outward extended position.

It can be seen that the embodiment illustrated in FIGS. 13A and 13B can be used to prevent the lid 151 of the cover assembly from being closed while the depressor member is in an extended position. This would, in turn, prevent the depressor member from contacting the IC chip before the lid is locked in its operative closed position, thereby preventing any contact with the IC chip at an angle that is not truly aligned with the z-axis of the socket. To operate this embodiment of the cover assembly, the lid portion is closed over the mounting frame of the cover assembly and then the locking tab of the latch mechanism pulled outwardly to both release the closure handle and to engage the bottom locking ridge of the latch mechanism into the locking channel in the side of the mounting frame. Holding the tab in this outwardly extended position as shown in FIG. 14A, the closure handle can be rotated such that the tab is retained by the outer circumference of the closure handle as shown in FIG. 14B. Full rotation of the closure handle will cause the depressor member on the underside of the lid to extend along the z-axis of the socket to contact and depress the IC chip as heretofore described.

Figure 15A:
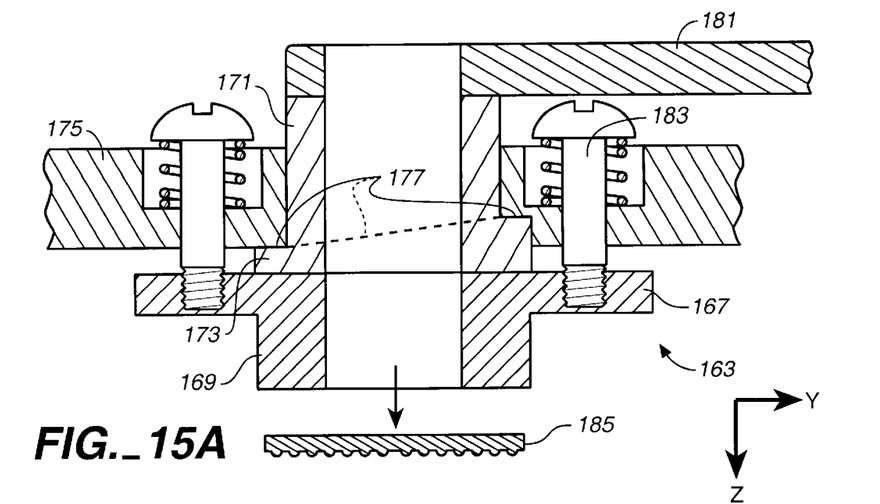
FIG. 15A is a cross-sectional fragmentary view in side elevation of a further embodiment of the invention showing an alternative construction for the cover assembly of the invention wherein single opposed cam surfaces are provided instead of a threaded structure for advancing the depressor member in the z-axis and showing the depressor member in its tracked position.
Figure 15B:
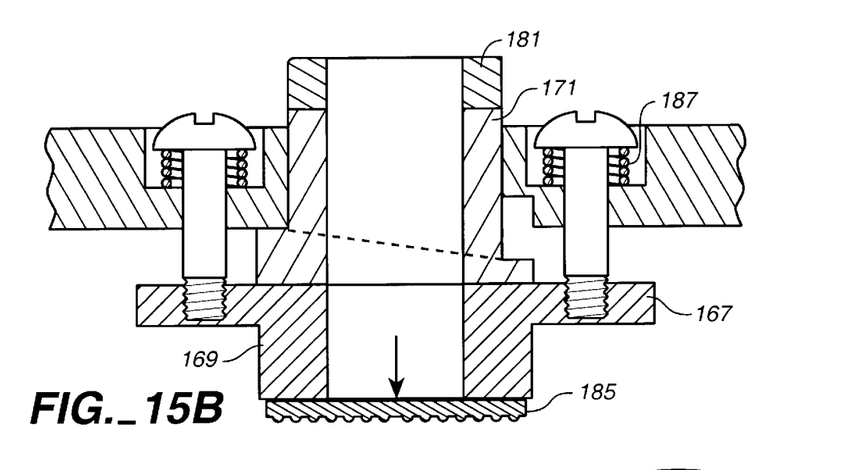
FIG. 15B is another cross-sectional fragmentary view thereof in side elevation showing the depressor member in its extended position for contacting the IC chip held in the IC socket.
Figure 15C:
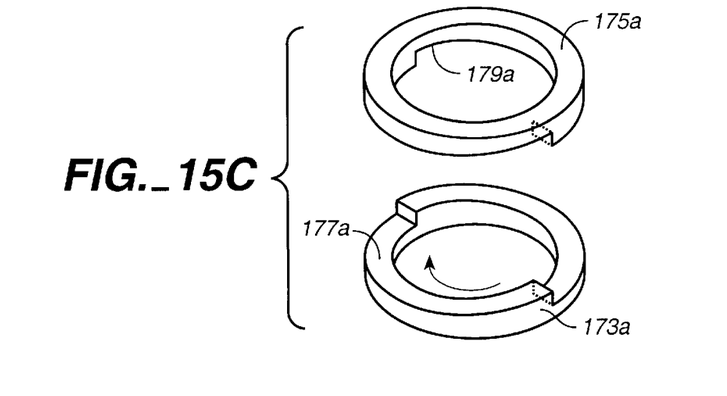
FIG. 15C is a pictorial view of two opposed cam surfaces representing the opposed cam surfaces in the embodiment of FIGS. 15A and 15B.

In the embodiment of the invention shown in FIGS. 15A and 15B the cover assembly for the IC socket (not shown) has a depressor plate 167 similar to the depressor plate 57 shown in FIGS. 5A and 5B. However, in this embodiment the depressor plate and its projecting depressor member 169 is advanced along the z-axis by means of a plunger ring 171 having bottom rim 173 sandwiched between the depressor plate 167 and the lid portion 175 of the cover assembly. The top of the bottom rim of the plunger ring has a cam surface 177 which suitably, engages a corresponding cam surface 179 on the underside of the lid 175 to cause the advance of the depressor plate when the plunger ring is rotated by closure handle 181. The principle of these cam surfaces is illustrated in FIG. 15C wherein an upwardly facing cam surface 177a of lower ring structure 173a (representing the rim of plunger ring 171) rotates on the downward facing cam surface 179a of ring structure 175a (representing the cam surface of the lid of the cover assembly). As the lower plunger ring structure 173a rotates in a clockwise direction against the cam surface of the upper ring structure 175a, the rings separate causing movement in the z-axis direction. Thus, by turning closure handle 181 to rotate the plunger ring, depressor plate 167, which is retained on the underside of lid 175 by spring loaded screw fasteners 183, moves in the z-axis direction from its retracted position shown in FIG. 15A to its extended position shown in FIG. 15B so as to contact IC chip 185 with a force normal to the x-y plane of the IC chip.

The materials used for the cover assembly of the invention will depend on the application. The latch members and closure handle of the cover assembly will normally be fabricated of a nonconductive material or conductive material such as aluminum covered with an insulating material for heat insulation. The lid and depressor elements can be of a heat conductive or non-conductive material as required.

It will be appreciated that the cover assembly of the invention can be provided in a variety of configurations other than illustrated herein wherein a depressor member associated with the cover assembly is advanced along the z-axis only after the cover is closed and locked in position as described herein. For example, the spring loading of the depressor plates 57, 167 illustrated in FIGS. 5A, 5B, 15A, and 15B, instead of being provided on the lid of the cover assembly as, for example, by screw head springs 187 shown in FIGS. 15A and 15B, could be provided between the depressor plate and the IC socket. In such a configuration, the depressor plate 167 of the embodiment shown in FIGS. 15A and 15B would preferably be carried on the lid 175 of the cover assembly so that it is allowed to float in the direction of the z-axis, while biasing elements interposed between the socket and plate maintain contact between the plate 167, plunger ring 171, and the lid. Also, the depressor plate could be fabricated in more than one part or provided in different configurations and shapes for providing desired z-axis contact with the top of the IC chip. For example, a separate depressor member in the form of a square or circular ring could be attached by suitable fastening means to the bottom of a planar depressor plate to provide a projecting contact for the chip. Still further, a separate cover plate could be inserted between the cover assembly lid and the depressor plate for providing the opposed cam surface for the plunger ring. Yet other configurations would be readily appreciated by persons of ordinary skill in the art.

While the present invention has been described in considerable detail in the foregoing specification and in the accompanying drawings, it shall be understood that it is not intended that the invention be limited to such detail, except as necessitated by the following claims.

We claim:

1. A cover assembly for operatively holding an IC chip in a chip cavity of an IC socket wherein said chip cavity extends into a top face of the IC socket in a defined z-axis, said cover assembly comprising a lid portion having a top side, an underside, and a defined z-axis, mounting means for mounting said lid portion in an operative position on the IC socket, said mounting means including cover locking means for locking said lid portion in an operative closed position in which the z-axis of said lid portion aligns with the z-axis of the chip cavity, said mounting means including slide rails for slidably engaging corresponding locking channels formed in the IC socket to which said lid potion is mounted, said slide rails being pivotally connected to said lid portion, such that, when said slide rails are engaged in locking channels of said socket, said lid potion can be pivoted on said slide rails into its operative closed position over the chip cavity of the IC socket, a normally retracted chip depressor member extendable from the underside and along the z-axis of said lid portion for contacting the IC chip in the chip cavity of the IC socket after said lid portion is in its operative closed position over the chip cavity, and depressor actuation means accessible from the top side of said lid portion for retractably advancing the chip depressor member along the z-axis of said lid portion when the lid portion is in its operative closed position, whereby the chip is depressed in the IC socket by a force parallel to the z-axis of the chip cavity and normal to the IC chip.

2. The cover assembly of claim 1 wherein said cover locking means include latch means on said lid portion for lockingly engaging at least one of said slide rails when said lid portion is pivoted to its operative closed position.

* * * * *

UNITED STATES PATENT AND TRADEMARK OFFICE
CERTIFICATE OF CORRECTION

PATENT NO. : 6,354,859 B1
DATED : March 12, 2002
INVENTOR(S) : Nasser Barabi and Siamak Jonaidi It is certified that error appears in the above-identified patent and that said Letters Patent is hereby corrected as shown below:

<u>Column 6,</u>
Line 56, after "so that it", add -- can be actuated to advance the depressor member --.

Signed and Sealed this

Ninth Day of September, 2003

JAMES E. ROGAN
*Director of the United States Patent and Trademark Office*